(12) United States Patent
Takiguchi (10) Patent No.: US 7,564,766 B2
(45) Date of Patent: Jul. 21, 2009

(54) LASER DRIVE DEVICE, LASER LIGHT EMITTING DEVICE AND LASER DRIVING METHOD

(75) Inventor: Yoshiro Takiguchi, Kanagawa (JP)

(73) Assignee: Sony Corporation (JP)

( * ) Notice: Subject to any disclaimer, the term of this patent is extended or adjusted under 35 U.S.C. 154(b) by 728 days.

(21) Appl. No.: 11/384,248

(22) Filed: Mar. 21, 2006

(65) Prior Publication Data

US 2006/0226129 A1 Oct. 12, 2006

(30) Foreign Application Priority Data

Mar. 25, 2005 (JP) ............................. 2005-087773
Dec. 22, 2005 (JP) ............................. 2005-370577

(51) Int. Cl.
*G11B 7/00* (2006.01)
(52) U.S. Cl. ........................ 369/116; 369/47.5; 369/100
(58) Field of Classification Search ........................ None
See application file for complete search history.

(56) References Cited

U.S. PATENT DOCUMENTS

| | | | |
|---|---|---|---|
| 3,946,335 | A | 3/1976 | De Loach, Jr. et al. |
| 5,446,716 | A * | 8/1995 | Eastman et al. .......... 369/47.51 |
| 6,115,338 | A * | 9/2000 | Masaki et al. ............ 369/47.52 |
| 6,215,094 | B1 | 4/2001 | Dausinger et al. |
| 7,414,952 | B2 * | 8/2008 | Kura et al. .................. 369/116 |

OTHER PUBLICATIONS

Takiguchi Y et al.: "Degradation due to catastrophic optical mirror damage in broad area laser diodes with optical feedback," 2005 Conference On Lasers And Electro-Optics Europe (IEEE Cat. No. 05$^{th}$8795) IEEE Piscataway, NJ, USA, 2005, p. 132, XP001879774; ISBN: 0-7803-8974-3.
Glass Alexander et al.: "Damage constraints in the design of high energy lasers for fusion application," 1974 Plenum Press, New York, NY, Aug. 13, 1973, pp. 149-169, XP009068867, Abstract, p. 150, paragraph 4—p. 151, paragraph 1.

(Continued)

*Primary Examiner*—Muhammad N. Edun
(74) *Attorney, Agent, or Firm*—Rader Fishman & Grauer PLLC; Ronald P. Kananen (57) ABSTRACT

A laser drive device, a laser light emitting device and a laser driving method capable of preventing deterioration or failure of a laser element due to returned lights by defining a control limitation value taking into account an affection of the returned lights to the laser element by calculating a control limitation value of an output or current of the laser element based on first laser characteristic information on transmittance or reflectance of an output end face of the laser element, second laser characteristic information on a rated output value, or a rated current value and an oscillation threshold current value and third laser characteristic information on a returned light rate to the output end face of the laser element, so that a control limitation value taking into account an affection of the returned light is determined; then, by comparing said calculated control limitation value with an input control value; and driving the laser element in accordance with the control value when the control value is smaller than the control limitation value.

9 Claims, 10 Drawing Sheets

OTHER PUBLICATIONS

Takiguchi, Yoshiro: "Characteristics of broad area laser diodes with optical feedback," Digest of Lectures of Association Conference of Applied Physics, 51st Spring Meeting, Japan Society of Applied Physics, Tokyo, Mar. 28-31, 2004, p. 1273, XP009068809.

Takiguchi, Yoshiro: "Characteristics of broad area laser diodes with optical feedback II (lambda =640nm)," Digests of Lectures of Association Conference of Applied Physics, 65th Autumn Meeting, Japan Society of Applied Physics, Sep. 1-4, 2004, p. 1017, XP009068812.

European Search Report, Application No. EP 06 25 1497, dated Jul. 19, 2006.

Yoshio Takiguchi, et al. "Characteristics of Broad-Area Laser Diodes with Optical Feedback" Digests of Lectures of Association Conference of Applied Physics, Spring 2004.

Yoshio Takiguchi, et al. "Characteristics of Broad-Area laser Diodes with Optical Feedback II ($\lambda$=640nm)" Digests of Lectures of Association Conference of Applied Physics, Autumn 2004.

* cited by examiner

LASER DRIVE DEVICE, LASER LIGHT EMITTING DEVICE AND LASER DRIVING METHOD

CROSS REFERENCES TO RELATED APPLICATIONS

The present invention contains subject matter related to Japanese Patent Application No. 2005-087773 filed in the Japanese Patent Office on Mar. 25, 2005 and No. 2005-370577 filed in the Japanese Patent Office on Dec. 22, 2005, the entire contents of which are incorporated herein by reference.

BACKGROUND OF THE INVENTION

1. Field of the Invention

The present invention relates to a laser drive device, laser light emitting device and a laser driving method, and it particularly relates to a laser drive device and a laser driving method for controlling an output of a laser element or a current to be supplied to the laser element, and a laser light emitting device provided with the laser drive device.

2. Description of the Related Art

In recent years, in the laser processing technology field of welding and quenching, etc., a replacement of a solid laser, such as a gas laser and a YAG, with a high-power semiconductor laser has progressed. Further, semiconductor lasers are expected to be applied to medical fields.

Figure 10:
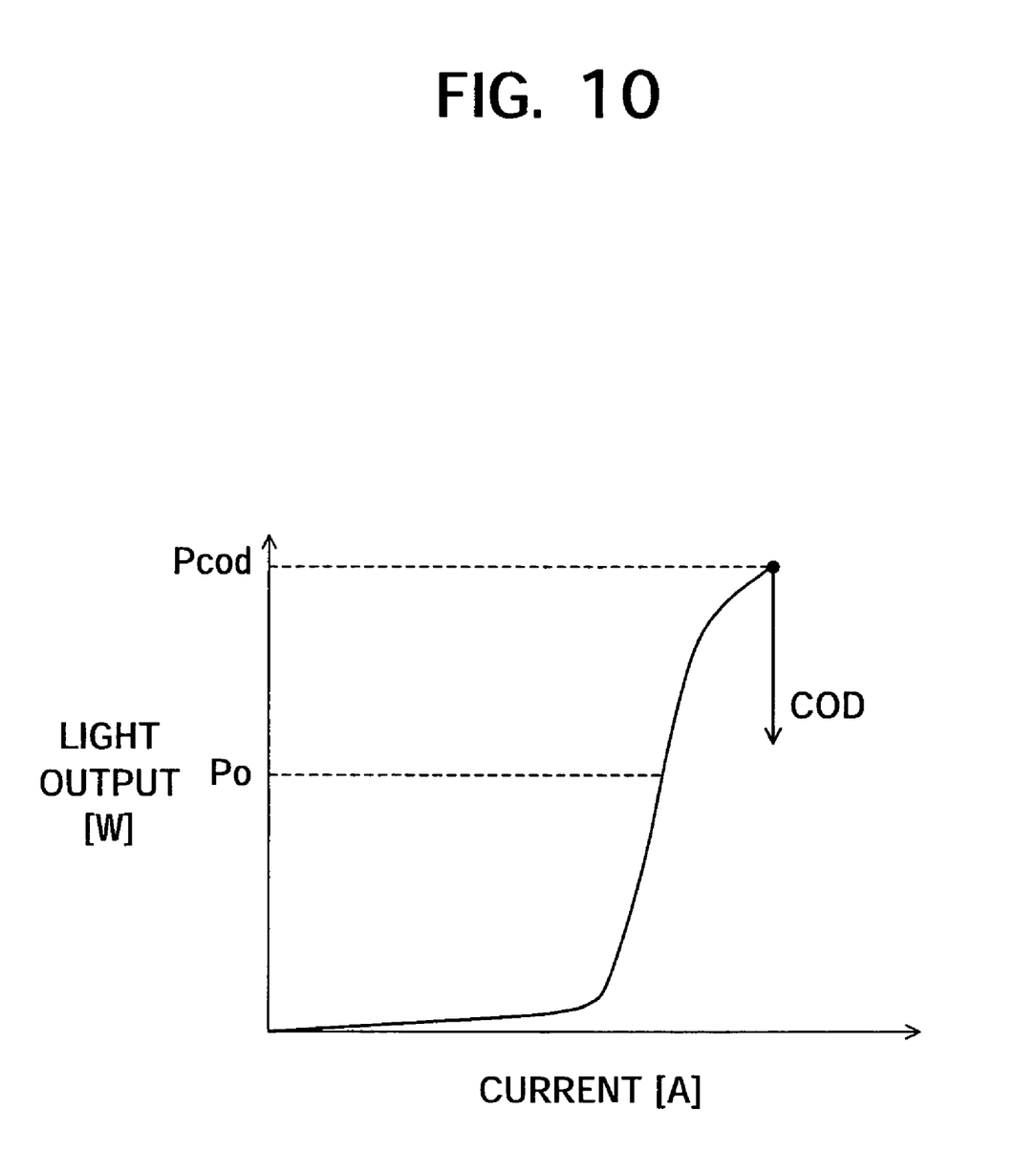
FIG. 10 is a view showing a relationship between a current to be supplied to a semiconductor laser and a light output.

FIG. 10 is a view showing a relationship between a current to be supplied to a semiconductor laser and a light output.

When a current is applied to a semiconductor laser and exceeds an oscillation start current (oscillation threshold current value), laser oscillation starts. As the applied current is further increased, the resultant light output also increases, however, when the applied current reaches a certain value, the resultant light output decreases. This phenomenon is caused that the light output at an output end face (chip end face) of the semiconductor becomes excessive and the output end face is subjected to catastrophic optical damage (COD).

To prevent the arising of the COD, a rated output value "Po" is normally set to be about half of a light output value Pcod at which the COD occurs. The semiconductor laser is used within a range of the rated output value by a user.

However, in the laser processing technology field, as mentioned above, it suffers from a disadvantage that even when using the semiconductor laser within the range of the rated output value Po, a reflected light from an object to be processed again is again input into the semiconductor laser as a returned light, and the returned light results in a deterioration or failure of the semiconductor laser.

See, (1) Yoshio Takiguchi, et al. "Characteristics of Broad-Area Laser Diodes with Optical Feedback" Digests of Lectures of Association Conference of Applied Physics, Spring 2004, and (2) Yoshio Takiguchi, et al. "Characteristics of Broad-Area Laser Diodes with Optical Feedback II ($\lambda$=640 nm)" Digests of Lectures of Association Conference of Applied Physics, Autumn 2004

The disadvantage is caused because, in the laser processing field, a high-power (W class) semiconductor laser is used and an affection by the returned light cannot be ignored. Also, in the laser processing field, an amount of the returned light from an object to be processed may become very large depending on the use condition by the user.

Since the affection by the returned light was not considered for defining the rated output value in the related art, the rated output value was not always applied as a value for guaranteeing the prevention of deterioration or failure of the laser element depending on the use condition by the user.

SUMMARY OF THE INVENTION

It is desired to provide a laser drive device capable of preventing the deterioration or failure of a laser element due to a returned light by defining a control limitation value when considering an affection of the returned light to the laser element; a laser light emitting device and a laser driving method.

To overcome the above disadvantages explained above, according to a first invention, there is provided a laser drive device, including a control limitation value calculation means for calculating a control limitation value of an output or current of a laser element based on a first laser characteristic information on transmittance or reflectance of an output end face of the laser element, second laser characteristic information on a rated current value and an oscillation threshold current value and third laser characteristic information on a returned light rate to the output end face of the laser element; a comparison means for comparing the calculated control limitation value with an input control value; and a power source unit for driving the laser element in accordance with the control value when the control value is smaller than the control limitation value.

In the laser drive device of the present invention above, a control limitation value of an output or current of the laser element is calculated by the control limitation value calculation means based on the first laser characteristic information, the second laser characteristic information and the third laser characteristic information. As a result, a control limitation value taking into account the affection of the returned lights is determined.

Then, the calculated control limitation value is compared with the input control value by the comparison means and, when the control value is smaller than the control limitation value, driving of the laser element is performed by the power source unit in accordance with the control value. Consequently, a laser element is driven always in a range of not exceeding the control limitation value.

To overcome the above disadvantages explained above, according to the present invention, there is provided a laser light emitting device, comprising a laser element; a control limitation value calculation means for calculating a control limitation value of an output or current of the laser element based on first laser characteristic information on transmittance or reflectance of an output end face of the laser element, second laser characteristic information on a rated current value and an oscillation threshold current value and third laser characteristic information on a returned light rate to the output end face of the laser element; a comparison means for comparing the calculated control limitation value with an input control value; and a power source unit for driving the laser element in accordance with the control value when the control value is smaller than the control limitation value.

In the laser light emitting device of the present invention described above, the control limitation value calculation means calculates a control limitation value of an output or a current of the laser element based on the first laser characteristic information, the second laser characteristic information and the third laser characteristic information. As a result, a control limitation value taking into account the affection of the returned lights is determined.

Then, the comparison means compares the calculated control limitation value with the input control value and, when the control value is smaller than the control limitation value, driving of the laser element is performed by the power source unit in accordance with the control value. Consequently, a laser element is driven always in a range of not exceeding the control limitation value.

To overcome the disadvantages explained above, according to the present invention, there is provided a laser driving method, including the steps of calculating a control limitation value of an output or current of the laser element based on first laser characteristic information on transmittance or reflectance of an output end face of the laser element, second laser characteristic information on a rated current value and an oscillation threshold current value and third laser characteristic information on a returned light rate to the output end face of the laser element; comparing the calculated control limitation value with an input control value; and driving the laser element in accordance with the control value when the control value is smaller than the control limitation value.

In the laser driving method of the present invention described above, the control limitation value of the output or current of the laser element is calculated based on the first laser characteristic information, the second laser characteristic information and the third laser characteristic information. Consequently, the control limitation value taking into account the affection of the returned lights is determined.

After that, the calculated control limitation value is compared with the input control value and, when the control value is smaller than the control limitation value, driving of the laser element is performed by the power source unit in accordance with the control value. Consequently, a laser element is driven always in a range of not exceeding the control limitation value.

According to the present invention, it is possible to prevent deterioration or failure of the laser element due to the returned lights by defining the control limitation value taking into account the affection of the returned light to the laser element.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, embodiments of the present invention will be explained with reference to the attached drawings.

First Embodiment

Figure 1:
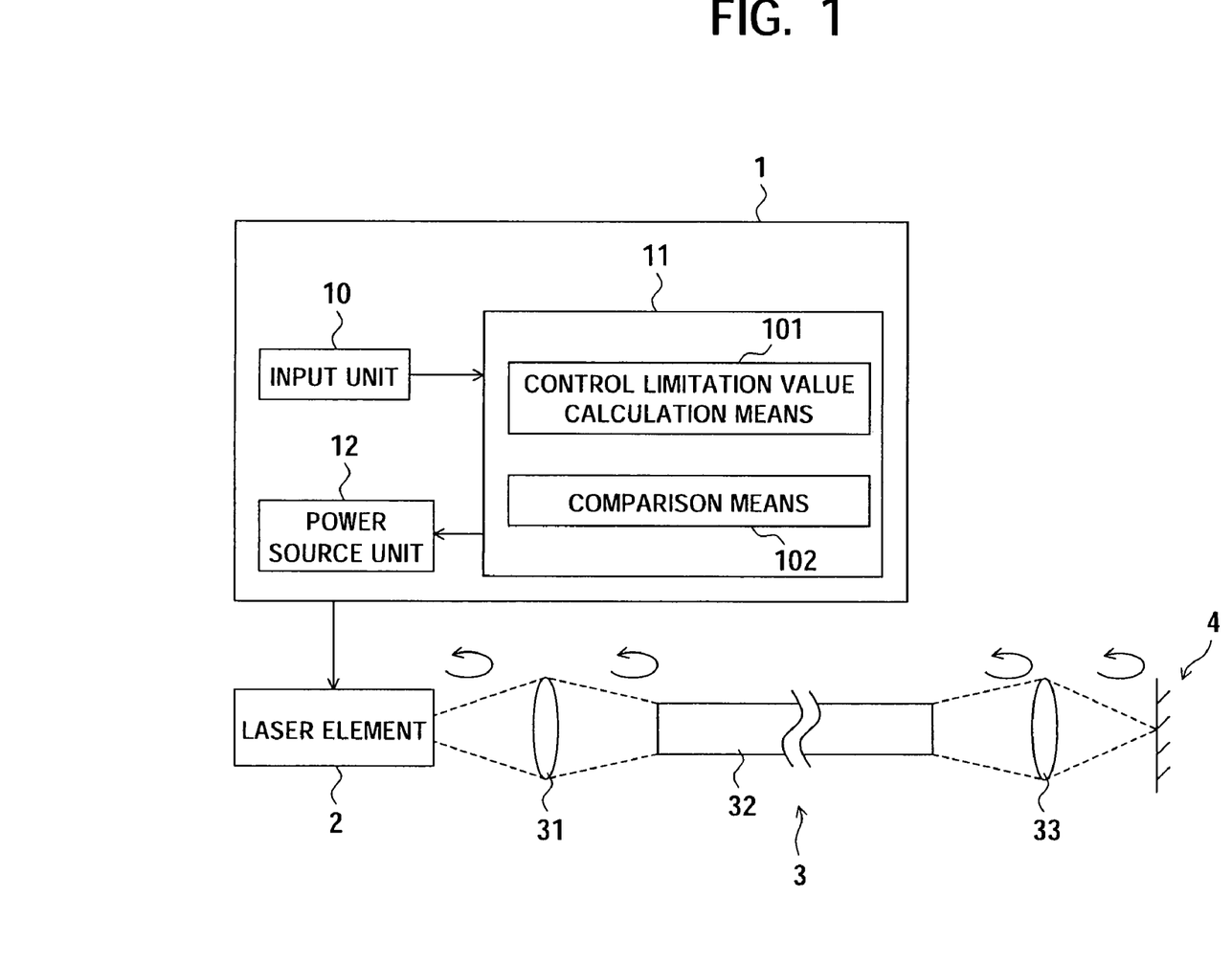
FIG. 1 is a view of an example of the configuration of a laser light emitting device according to a first embodiment.

FIG. 1 is a view showing an example of the configuration of a laser light emitting device according to the present embodiment.

The laser light emitting device according to the present embodiment includes a laser drive device 1, a laser element 2 and an optical system 3.

The laser element 2 emits a laser light as a result of being supplied with a drive current from the laser drive device 1. The laser element 2 is, for example, a semiconductor laser. Note that the laser element 2 is not particularly limited to a semiconductor laser as far as it is a laser (for example, a fiber laser), wherein heating by light absorption on the output end surface causes deterioration or failure.

An optical system 3 is provided for guiding the laser light from the laser element 2 to an object 4 to be processed 4. The optical system 3 includes, for example, a lens 31, an optical fiber 32 and a lens 33. Note that the configuration of the optical system 3 is not particularly limited and may be variously changed in accordance with an application of the laser light emitting device.

The laser light emitted from the laser element 2 is focused on the optical fiber 32 by the lens 31. The laser light guided in the optical fiber 32 converges on the object 4 to be processed by the lens 33. Consequently, processing, etc. is performed on the object 4 to be processed.

In the use condition above, reflected lights from the lens 31, a focal surface on the optical fiber 32, the lens 33 and the object 4 to be processed, as returned lights, is inputted to an output end face of the laser element 2. The laser drive device 1 according to the present embodiment takes into account an affection of the returned lights to correct the rated values and obtain the control limitation value. The output value and the current values are the rated values. When a rated output value is used, a control limitation output value is obtained as the value for limiting the control, while when using a rated current value, a limit current value is obtained as the control limitation value.

The laser drive device 1 for driving the laser element 2 includes an input unit 10, a control unit 11 and a power source unit 12.

The input unit 10 is composed, for example, of a mouse, keyboards or operation switches, etc. First to third laser characteristic information is input from the input unit 10. The first laser characteristic information is on transmittance or reflectance of the output end face of the laser element. The second laser characteristic information is on a rated output value of the laser element or a rated current value and oscillation threshold current amount when there is no returned light. The third laser characteristic information is on the returned light rate (a ratio of the returned lights against the output) to the output end face of the laser element. In the present embodiment, the returned light is an assumable maximum returned light.

The control unit 11 sets a control limitation value based on the laser characteristic information input from the input unit 10. The control unit 11 includes a control limitation value calculation means circuit 101 and a comparison means circuit 102.

The control limitation value calculation means circuit 101 corrects a rated value of the output or current based on the laser characteristic information and calculates a control limitation value taking into account the affection of the returned lights. Below, an example of calculating an output limit value as the control limitation value based on the laser characteristic information will be explained.

Here, it is assumed that a rated output value of the laser element 2 is Po (refer to FIG. 6), transmittance (intensity) on the output end face of the laser element 2 is T and a returned light rate (intensity) against the output is Rext (returned light intensity/output). When a reflectance R2 is given instead of the transmittance on the end face of the output, the output end face transmittance T is calculated by using the formula (1) below.

$$T = 1 - R2 \quad (1)$$

Then, from a calculation expressed by the formula (2) below, the output limit value Po_ofb considering an affection of the returned light is determined.

$$Po\_ofb = \frac{Po}{1 + R_{ext}T + 2\sqrt{R_{ext}T}} \quad (2)$$

When a rated current value and an oscillation threshold current value are given instead of the rated output value of the laser element 2, by assuming that the rated current value is Io and the oscillation threshold current value is Ith, the current limit value Io_ofb considering an affection of the returned light is determined from a calculation expressed by the formula (3) below.

$$Io\_ofb = Ith + \frac{Io - Ith}{1 + R_{ext}T + 2\sqrt{R_{ext}T}} \quad (3)$$

The comparison means 102 compares the control limitation value calculated by the control limitation value calculation means 101 with a control value input from the input unit 10. The control value is an output value or a current value desired by the user.

When the control value input by the user is smaller than the calculated control limitation value, a control signal is output from the control unit 11 to the power source unit 12, and the power source unit 12 drives the laser element 2 in accordance with the control value desired by the user. For example, when an output value is input as a control value, the power source unit 12 performs, for example, automatic power control (APC) for maintaining the output value of the laser element 2 to be always the output value desired by the user. Alternately, when a current value is input as a control value, the power source unit 12 performs automatic current control (ACC) for maintaining the drive current to the laser element 2 to be always a current value desired by the user.

When the control value input by the user is larger than the calculated control limitation value, it is determined to be an error. In that case, for example, a not shown display unit displays that it is error to prompt the user to change the input value. Alternately, the power source unit 12 forcibly drives the laser element 2 with the control limitation value.

Figure 2:
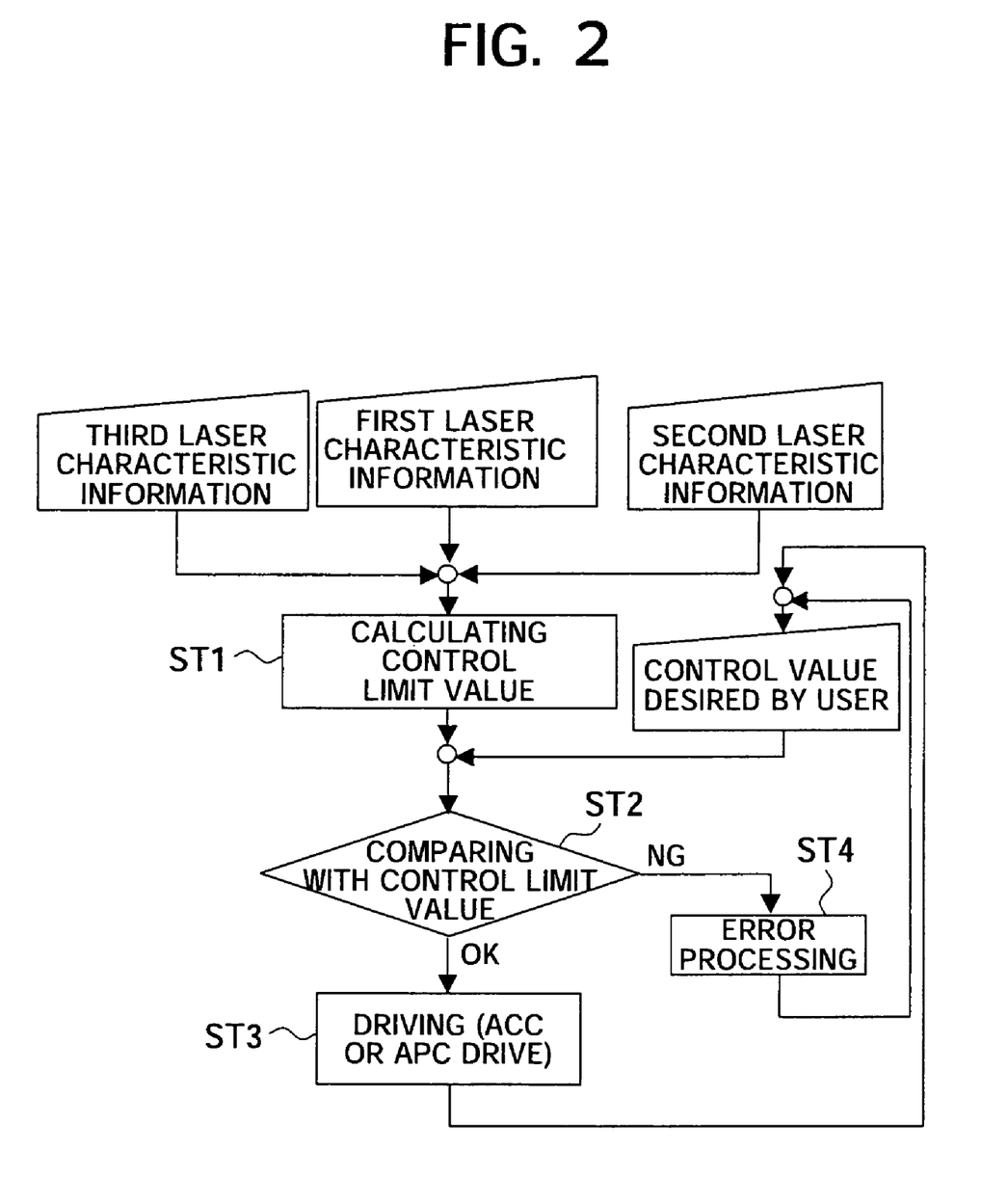
FIG. 2 is a flowchart of a laser driving method according to the first embodiment.

Next, the driving method of the laser element 2 in the laser light emitting device will be explained with reference to the flowchart in FIG. 2.

First, before driving the laser element 2, the user inputs first to third laser characteristic information and a desirable control value. The first laser characteristic information is on transmittance or reflectance of the output end face of the laser element. The second laser characteristic information is on a rated output value of the laser element or a rated current value and oscillation threshold current amount when there is no returned light. The third laser characteristic information is on the returned light rate to the output end face of the laser element. In the present embodiment, the returned light is an assumable maximum returned light. An output value and a current amount are the control values.

Based on the above laser characteristic information, the control limitation value calculation means 101 of the control unit 11 calculates a control limitation value taking into account the affection of the returned lights (step ST1). The calculation method of the control limitation value is as explained above.

The comparison means 102 of the control unit 11 compares the control value desired by the user with the calculated control limitation value (step ST2).

When the control value desired by the user does not exceed the control limitation value, the power source unit 12 supplies a drive current to the laser element 2 so as to obtain the control value desired by the user (step ST3). When an output value is input as the control value desired by the user, the power source unit 12 performs the APC drive. Alternately, when a current amount is input as the control value desired by the user, the power source unit 12 performs the ACC drive.

When the control value desired by the user is larger than the calculated control limitation value, it is determined to be an error (step ST4). In that case, for example, a not shown display unit indicates that it is an error to prompt the user to change the control value and processing in the step ST2 is performed again. Alternately, the power source unit 12 may forcibly drive the laser element 2 with the control limitation value.

Next, features and effects of the present embodiment will be explained.

When an output value Pcod which may lead a catastrophic optical damage (COD) to the laser element 2 in the case where there is no returned light, is substituted as the rated output value Po in the above formula (2), an output value Pcod_ofb causing the catastrophic optical damage in the case where there are returned lights is expressed by the formula (4) below as a coherence=1 of the laser.

$$Pcod\_ofb = \frac{Pcod}{1 + R_{ext}T + 2\sqrt{R_{ext}T}} \quad (4)$$

Figure 3:
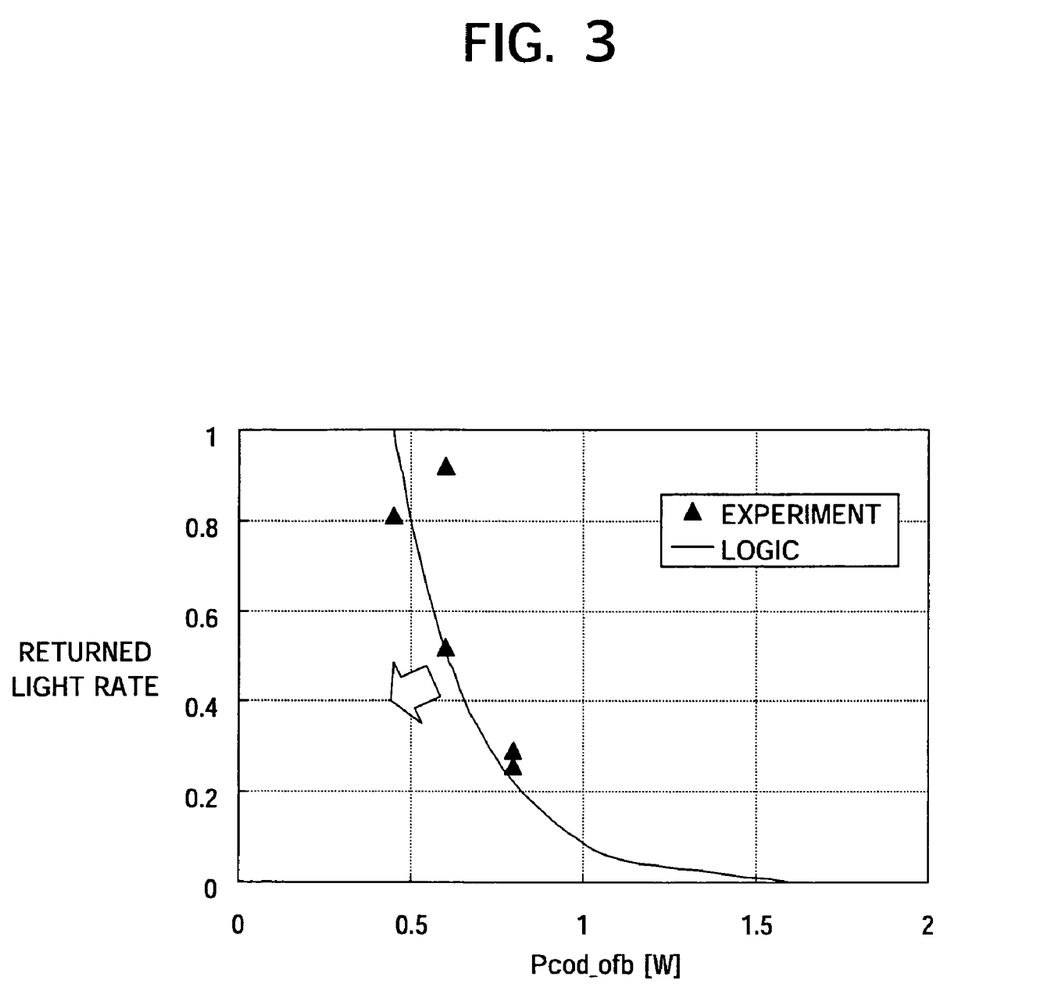
FIG. 3 is a view showing a relationship between an output value Pcod_ofb and a returned light rate when the laser element has suffered from a catastrophic optical damage in a relationship between the logical formula and experiment values.

A result of actually confirming whether the above formula (4) is valid or not by an experiment is shown in FIG. 3. In FIG. 3, the solid line is a logical curve based on the formula (4), and triangle marks are parameter positions where deterioration of the laser element 2 arose in the experiment. By comparing both, it is considered that the formula (4) is valid.

When the output value is smaller than the logical curve based on the above formula (4), that is, when using an output value in a range, which is on the arrowed side of the logical curve in the figure, deterioration or failure of the laser element 2 can be prevented. In the laser drive device 1 according to the present embodiment, the control limitation value Po_ofb is calculated by using a rated output value Po of about one half a value of the Pcod, and a safety margin is secured. The same can be applied to the rated current value Io and the control limitation value Io_ofb.

As explained above, according to the laser drive device, laser light emitting device and the laser driving method according to the present embodiment, deterioration or failure of the laser element due to the returned lights can be prevented by defining the control limitation value taking into account the affection of the returned lights on the laser element and always driving the laser element 2 within the control limitation value range.

Second Embodiment

Figure 4:
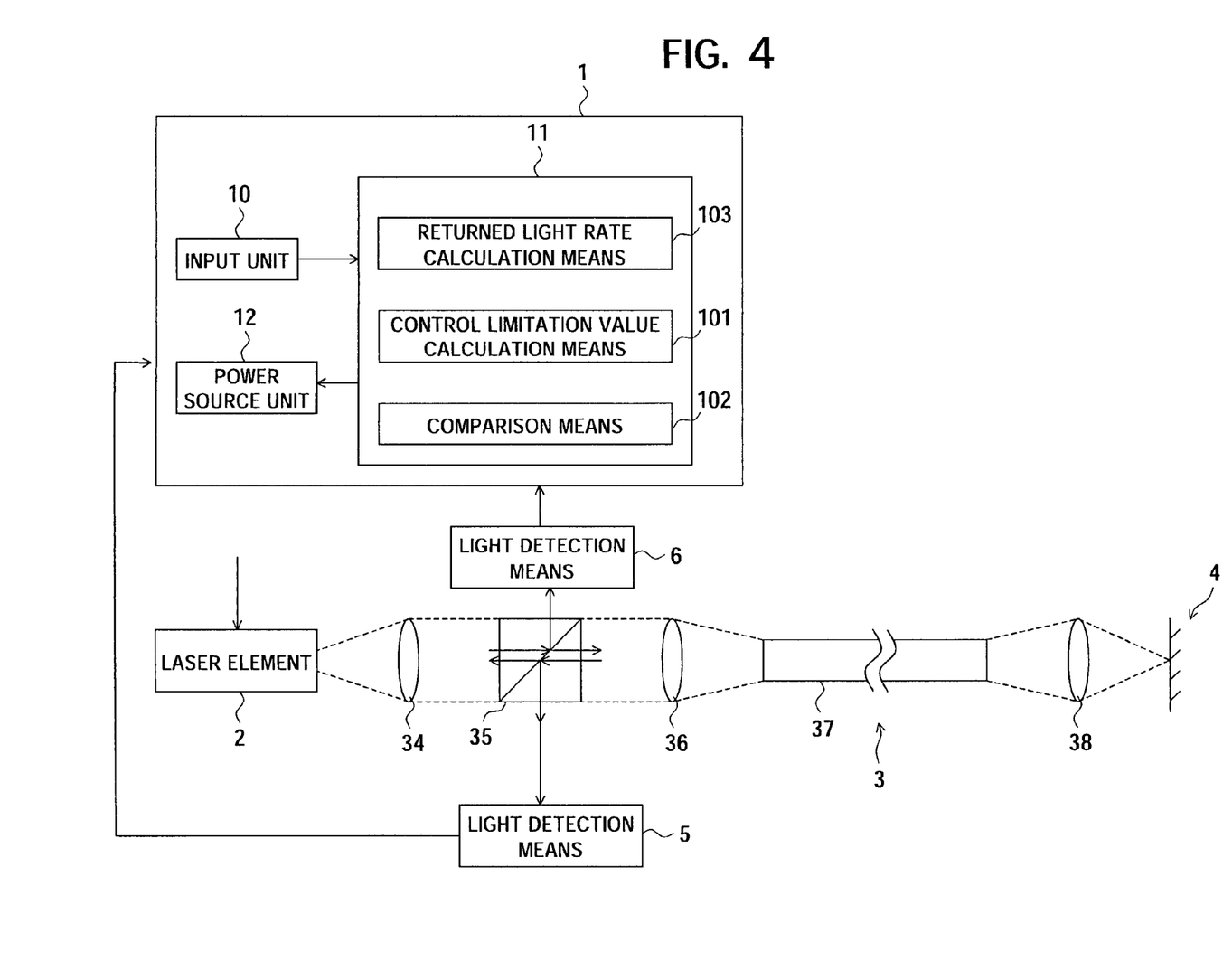
FIG. 4 is a view of an example of the configuration of a laser light emitting device according to a second embodiment.

FIG. 4 is a view showing an example of the configuration of a laser light emitting device according to the second embodiment. Note that the same reference numbers are given to the same components as those in the first embodiment and the explanation will be omitted.

In the first embodiment, an example of inputting a returned light rate as third laser characteristic information by the user side was explained. In the present embodiment, the returned light rate is automatically calculated by monitoring an operation condition of the laser element 2.

The laser light emitting device according to the present embodiment includes a laser drive device 1, a laser element 2, an optical system 3, an optical detection means circuit 5 and an optical detection means circuit 6. Also, in the present embodiment, a control unit 11 of the laser drive device 1 includes a control limitation value calculation means circuit 101, a comparison means circuit 102 and a returned light rate calculation means circuit 103.

The optical system 3 includes, for example, a lens 34, a beam splitter 35, a first lens 36, an optical fiber 37 and a second lens 38. Note that the configuration of the optical system 3 is not particularly limited and may be variously modified in accordance with the application of the laser light emitting device. The beam splitter 35 corresponds to the light splitting means of the present invention.

A laser light emitted from the laser element 2 irradiates the beam splitter 35 from the lens 34. The laser light inputted into the beam splitter 35 is split into two: a laser light passing through the beam splitter 35 and a laser light reflected by the beam splitter 35. The laser light reflected by the beam splitter 35 is inputted into the light detection means 6. The laser light passed through the beam splitter 35 is focused on the optical fiber 37 by the lens 36, and the laser light guided in the optical fiber 37 converges on the object 4 to be processed by the lens 38. Consequently, processing, etc. is performed on the object 4 to be processed.

In the above use condition, lights reflected by the lens 36, a focal surface of the optical fiber 37, the lens 38 and the object 4 to be processed are inputted into the beam splitter 35 and split into a light inputted into the output end face of the laser element 2 and a light inputted into the optical detection means 5.

The light detection means 5 detects the light intensity of a returned light reflected by the beam splitter 35. The optical detection means 5 is composed, for example, of a photo diode. The light-detection means 5 outputs a signal showing the detected light intensity to the control unit 11.

The light detection means 6 detects the light intensity of the laser light reflected by the beam splitter 35 among laser lights emitted from the laser element 2. The light detection means 6 is composed, for example, of a photo diode. The light detection means 6 outputs a signal indicating the detected light intensity to the control unit 11. Note that when the laser element 2 is provided with the light detection means 6, it may be used.

The returned light rate calculation means 103 of the control unit 11 calculates a returned light rate based on the returned light intensity detected by the light detection means 5 and a laser output value detected by the light detection means 6. Here, against the laser light output value detected by the light detection means 6, an output value of the laser light actually emitted from the laser element 2 is obtained by using a rate of the reflected light and transmitted light of the beam splitter 35. Also, against the returned light intensity detected by the light detection means 5, actual returned light intensity inputted again into the laser element is obtained by using the rate of the reflected light and transmitted light of the beam splitter 35.

The control limitation value calculation means 101 corrects a rated value of the output or current based on the first laser characteristic information and second laser characteristic information input to the input unit 10 and the calculated returned light rate and calculates the control limitation value taking into account the affection of the returned lights.

The configuration of the comparison means 102 and the power source unit 12 and that of the laser element 2 are the same as those in the first embodiment and the explanation will be omitted.

Figure 5:
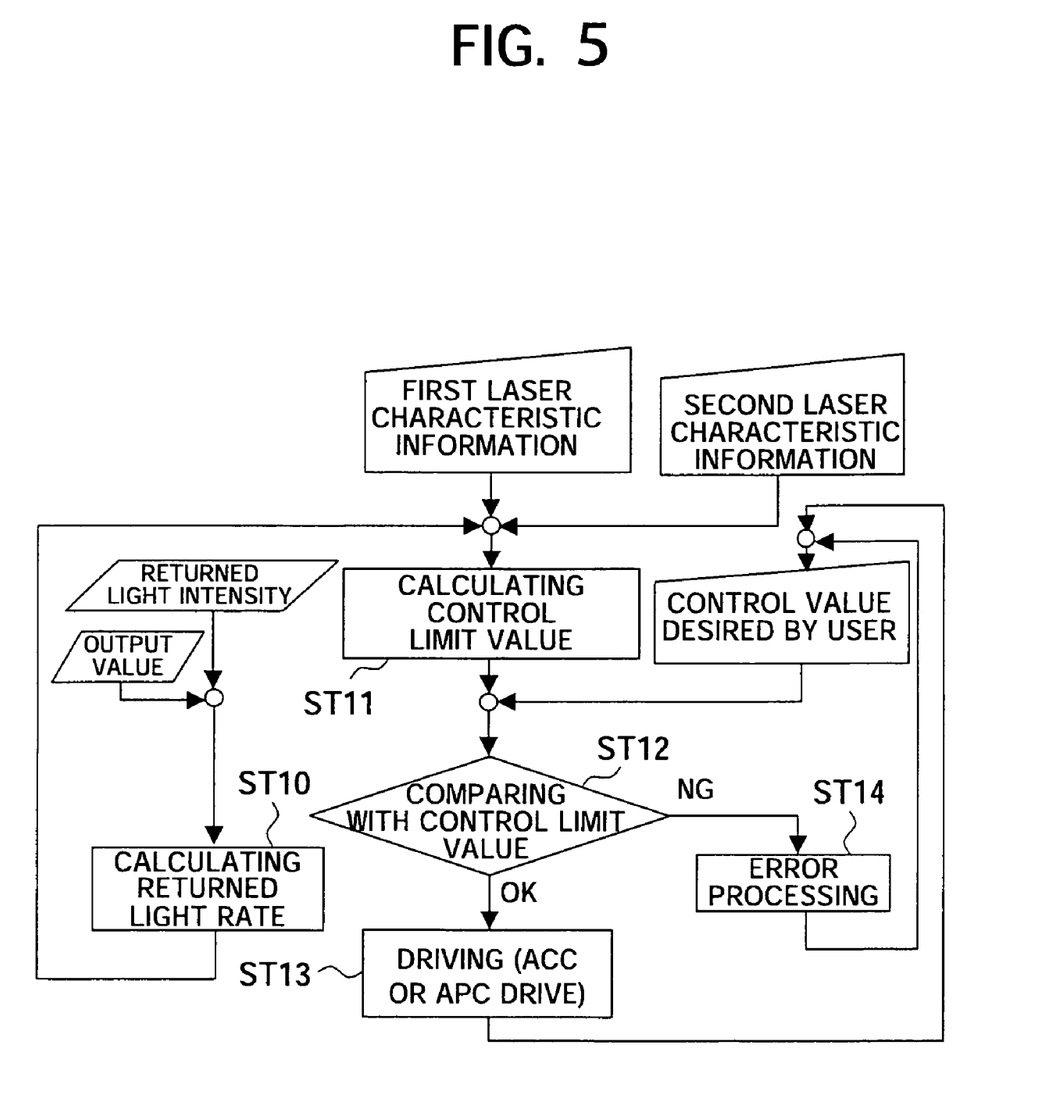
FIG. 5 is a flowchart of a laser driving method according to the second embodiment.

Next, a driving method of a laser element 2 in the laser light emitting device will be explained with reference to the flowchart in FIG. 5.

First, before driving the laser element 2, the user inputs first and second laser characteristic information and a desired control value. The first laser characteristic information is on a rated output value of the laser element or rated current value and oscillation threshold current value. At this time, the returned light rate dose not have to be input by the user. An output value and a current amount are included in the control value.

Then, the laser drive device 1 drives the laser element 2. After laser outputting starts, the returned light rate calculation means 103 of the control portion 11 calculates the returned light rate based on the returned light intensity detected by the light detection means 5 and the output value detected by the light detection means 6 (step ST10). The calculation method of the returned light rate is as explained above.

Based on the returned light rate calculated by the returned light rate calculation means 103 and the first and second laser characteristic information input by the user, the control limitation value calculation means 101 of the control unit 11 calculates the control limitation value taking into account the affection of the returned light (step ST11). The calculation method of the control limitation value is as explained above.

The comparison means 102 of the control unit 11 compares the control value desired by the user with the calculated control limitation value (step ST12).

When the control value desired by the user does not exceed the control limitation value, the power source unit 12 supplies a drive current to the laser element 2 so as to obtain the control value desired by the user (Step ST13). When an output value is input as the control value desired by the user, the power source unit 12 performs APC drive. Alternately, when a current value is input as the control value desired by the user, the power source unit 12 performs ACC drive.

When the control value desired by the user is larger than the calculated control limitation value, it is determined to be an error (step ST14). In that case, for example, the not shown display unit displays that it is an error to prompt the user to change the control value and the processing in the step ST12 is performed again. Alternately, the power source unit 12 may forcibly drive the laser element 2 with the control limitation value.

In the present embodiment, processing in the step ST10 to step ST14 is repeatedly performed during the laser element 2 emits a laser light. Therefore, the returned light rate is always updated in accordance with the use condition of the laser.

According to the laser drive device, the laser light emitting device and the laser driving method according to the present embodiment explained above, in the same way as in the first embodiment, it is possible to prevent deterioration or failure of the laser element due to the returned light by defining the control limitation value taking into account the affection of the returned lights to the laser element and driving the laser element 2 always with a value not in excess of the control limitation value.

Furthermore, being different from the first embodiment wherein the user has to input the assumable maximum returned light rate, an actual returned light rate is calculated by monitoring the operation condition of the laser element 2. Therefore, the control limitation value does not become unnecessarily small and the laser element 2 can be driven with the largest possible output.

Also, among laser characteristic information required to be input by the user, the returned light rate requires specialized knowledge the most. Therefore, by eliminating the need for inputting the assumable highest returned light rate for user, users with poor specialized knowledge can also feel safe to use the device without causing any deterioration or failure of the laser element 2.

Third Embodiment

Figure 6:
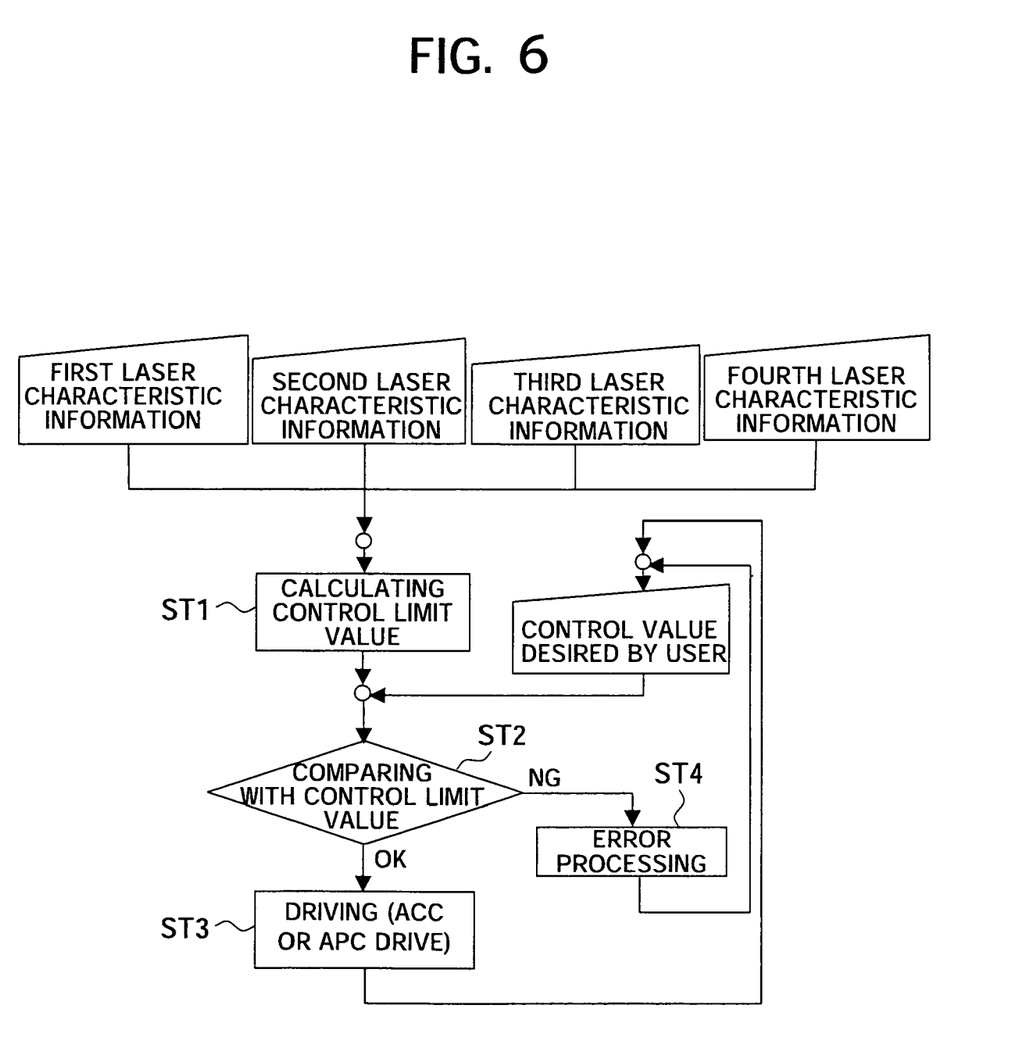
FIG. 6 is a view showing a flow of a laser driving method according to a third embodiment.

FIG. 6 is a flowchart showing a laser driving method by a laser light emitting device according to the third embodiment. The present embodiment has a characteristic that the control limitation value calculation means 101 calculates a control limitation value by using fourth laser characteristic information on spot size information of the returned lights in addition to the first to third laser characteristic information. Accordingly, the basic configuration of the laser drive device and the laser light emitting device and procedure of the laser driving method are the same as those in the first embodiment, so that explanations thereof will be omitted.

The formula (2) above used in the first embodiment is valid in the case of a uniform returned light. In the present embodiment, as explained above, wavefront control by using a spatial light modulator and an example being affectionate with the case of an uneven returned light due to spot deviation on the object to be processed will be explained.

For example, in the case where spot deviation arises on the object to be processed 4, returned lights diffuse (being out of the active layer) at the output end face of the laser element 2 to irradiate again or, inversely, a tiny spot is formed by converging. When a spot arises, light density becomes high at that portion and easily results in deterioration. Therefore, the spot size has to be estimated, and an equivalent returned light intensity on the spot portion has to satisfy the above formula (2).

When assuming that the refractive index of the active layer of the laser element 2 is "n", a wavelength of the laser light is "λ", a size of the active layer (here, a width of the active layer) is "Ws", a beam quality in the width direction of the active layer is "M²" (M-square value), and a numerical aperture of a lens on the first stage is "NA", the minimum spot size (half-value width) "ω" formed on the output end face of the laser element 2 is expressed by the next formula (5). The lens on the first stage indicates a lens closest to the laser element 2.

$$\omega = M^2 \frac{n\lambda}{NA} \tag{5}$$

The above explanation is based on an assumption of a single mode being in the thickness direction of the active layer. When not in a single mode in the thickness direction of the active layer, it is preferable that a thickness of the active layer and a beam quality "M²" in the thickness direction of the active layer are added.

Since the returned lights gather on the spot, an affectionate returned light rate "Reff" of the region becomes multiplied by Ws/ω times and is expressed by the next formula (6). The "Rext" in the formula indicates a value of (returned light intensity)/output.

$$R_{eff} = \frac{NA}{M^2} \frac{Ws}{n\lambda} R_{ext} \tag{6}$$

From the above formula (6), it is known that when using a lens having a large NA or when the beam quality is high (M² is small), the affectionate returned light intensity becomes high. Accordingly, it is known that it is significant to use a lens having a small NA and to make the beam quality poor as far as the optical system on the laser emission side permits to suppress the deterioration of the laser due to the returned light. When assuming that an entire angle of a radiation angle of the laser light from the laser element 2 is θ and a numerical aperture of the lens on the first stage is NA, it is preferable that sin θ=(θ/2)≧NA is satisfied.

Figure 7:
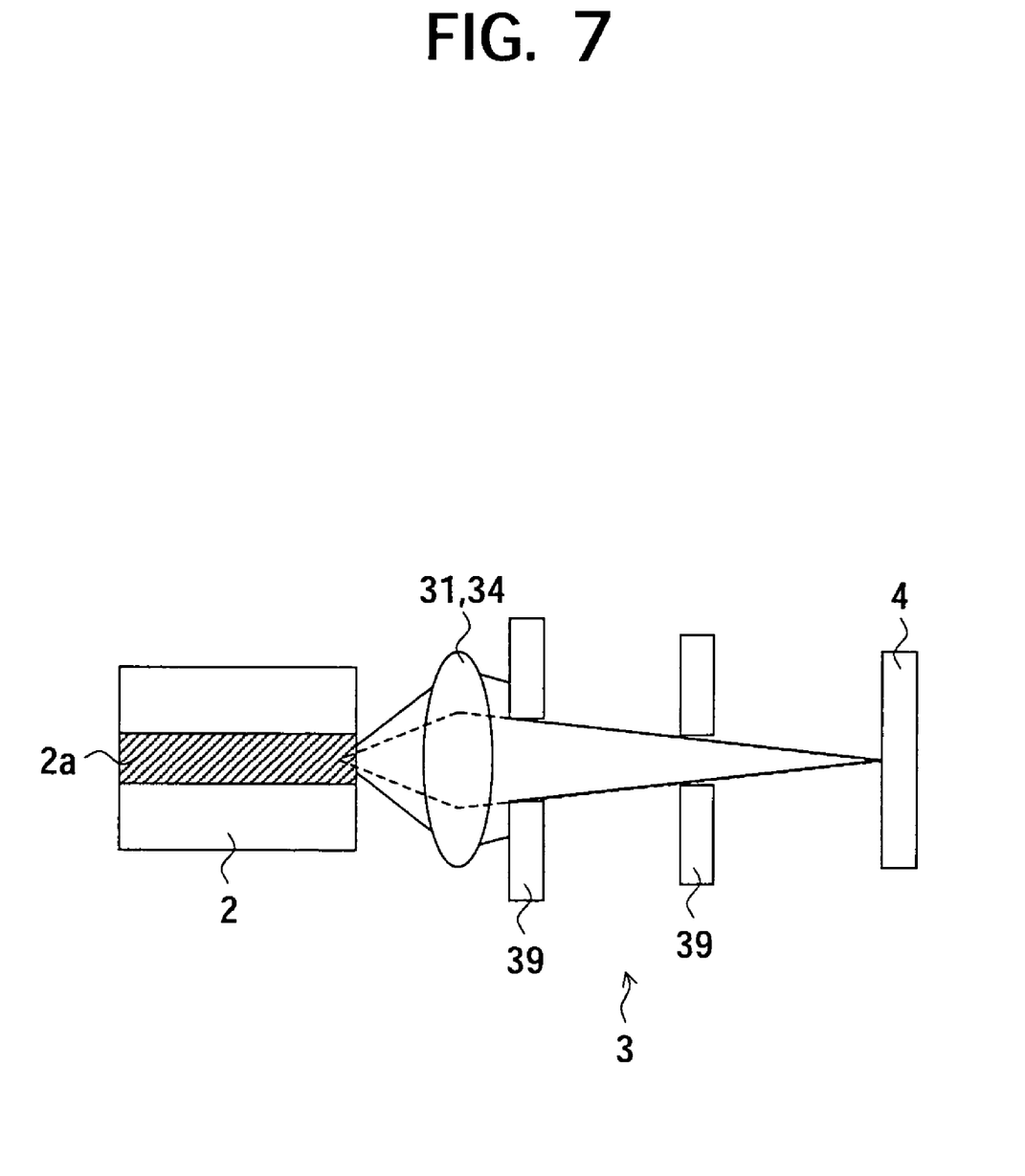
FIG. 7 is a view for explaining a numerical aperture NA of a lens.

Note that instead of using a lens having a small NA, a diaphragm may be added to obtain an equivalent value to that of the small-NA lens. FIG. 7 is a view of an example of the optical system 3 and shows an example of providing the first-stage lens (corresponding to the lens 31 in the first embodiment and the lens 34 in the second embodiment) of the laser element 2 having an active layer 2a and two diaphragms 39 between the laser element 2 and the object 4 to be processed. In this case, NA in the above formulas (5) and (6) is an affectionate value taking into account the diaphragms.

In the present embodiment, the control limitation value calculation means 101 uses "Reff" instead of the "Rext" in the formula (2) explained in the first embodiment to calculate the control limitation value. Namely, the control limitation value is calculated by the formula (7) below. Note that, when calculating the limit current value Io_ofb, it may be calculated by changing "Rext" to "Reff" in the above formula (3).

$$P_{o\_ofb} = \frac{P_o}{1 + R_{eff} T + 2\sqrt{R_{eff} T}} \tag{7}$$

When an output value "Pcod" causing catastrophic optical damage (COD) of the laser element 2 in the case without any returned light (refer to FIG. 10) is substituted as the rated output value Po, an output value Pcod_ofb causing catastrophic optical damage in the case with a returned light as a coherence 1 of the laser is expressed by the formula (8) below.

$$P_{\text{cod\_ofb}} = \frac{P_{COD}}{1 + R_{\text{eff}} T + 2\sqrt{R_{\text{eff}} T}} \qquad (8)$$

Figure 8:
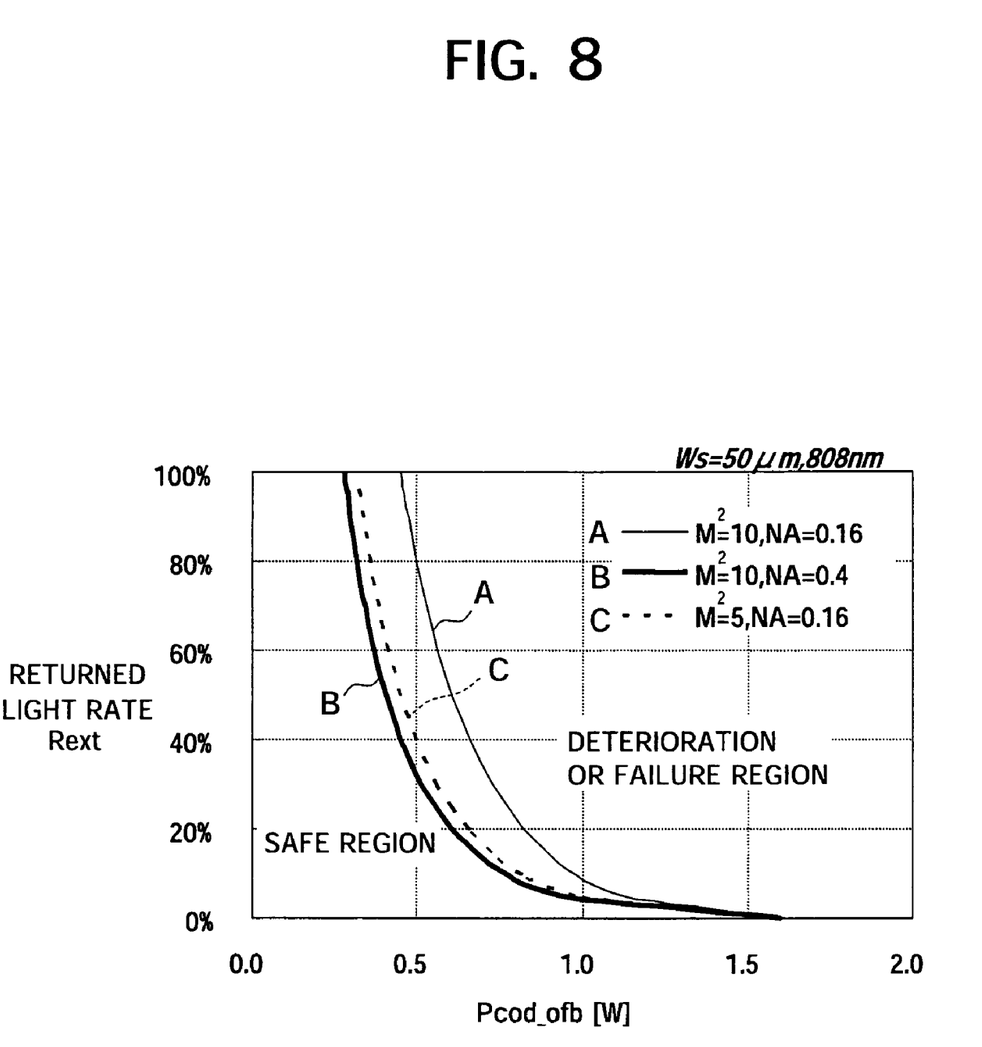
FIG. 8 is a view showing a relationship between an output value Pcod_ofb and a returned light rate when the laser element has suffered from catastrophic optical damage.

FIG. 8 expresses the above formula (8) by a graph by using parameters of a typical broad area type semiconductor laser. The graph A ($M^2=10$ and NA=0.16) shows a state of a uniform returned light, wherein the result is equivalent to that in the case of using the above formula (4). On the other hand, in the case of the graph C ($M^2=5$ and NA=0.16), wherein the beam quality is high, and in the case of the graph B ($M^2=10$ and NA=0.4), wherein a larger NA lens is provided immediately in front of the laser element 2, it is known that a value of Pcod_ofb decreases and deterioration is easily caused.

When the output value is smaller than the above graph, deterioration or failure of the laser element 2 can be prevented. In the laser drive device 1 according to the present embodiment, the control limitation value Po_ofb is calculated by using a rated output value Po that is one a half a value of Pcod and the safety margin is secured. This is also the same in the rated current value Io and the control limitation value Io_ofb.

As explained above, according to the laser drive device, the laser light emitting device and the laser driving method according to the present embodiment, even in the case where an uneven returned light arises, such that returned lights partially gather at a specific part of the laser element, deterioration or failure of the laser element due to the returned lights can be prevented.

Fourth Embodiment

Figure 9:
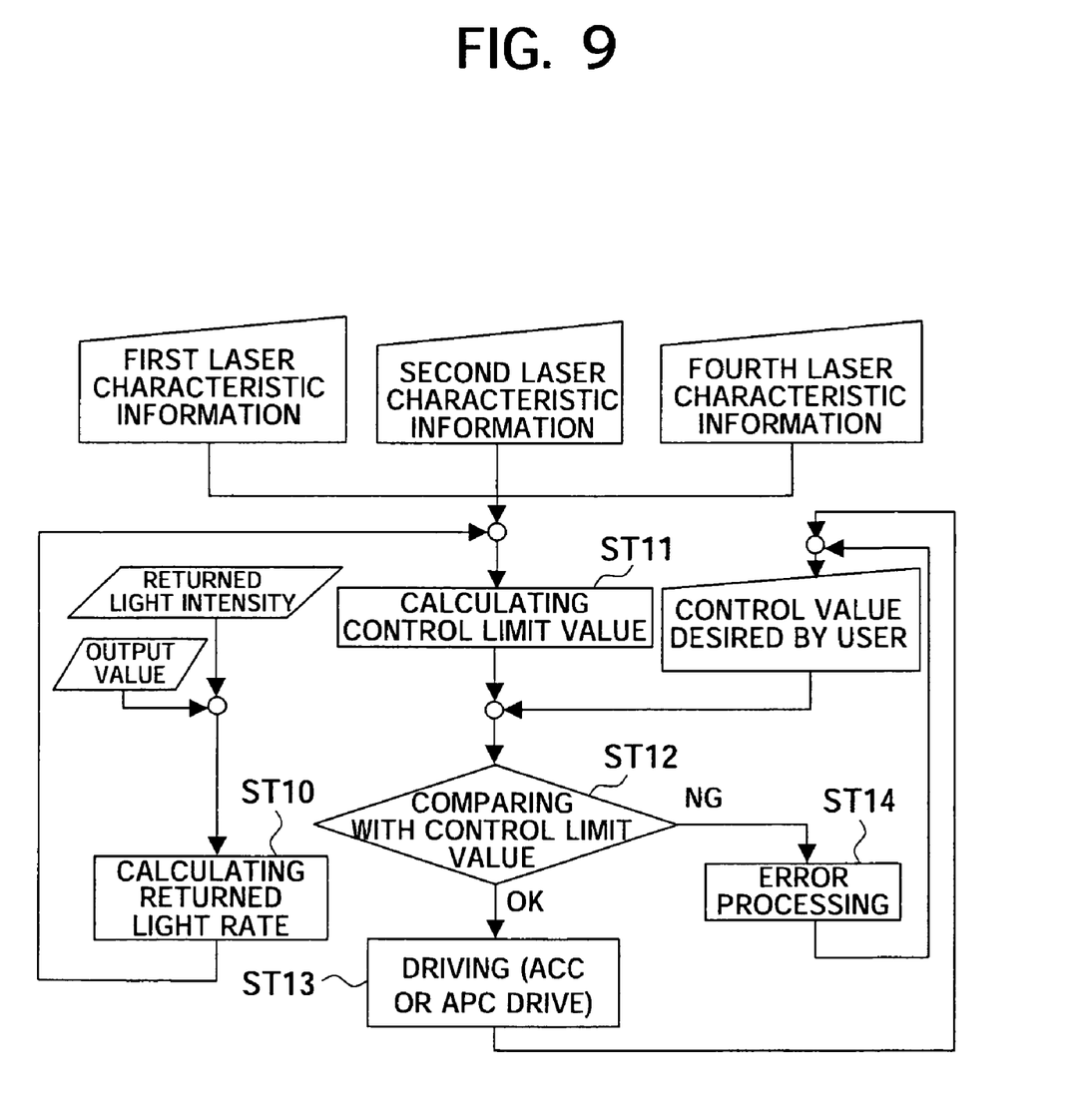
FIG. 9 is a flowchart of a laser driving method according to a fourth embodiment.

FIG. 9 is a flowchart showing a laser driving method by a laser light emitting device according to a fourth embodiment. In the fourth embodiment, fourth laser characteristic information on spot size information of returned lights is used in addition to the first to third laser characteristic information in the laser drive device, the laser light emitting device and the laser driving method according to the second embodiment.

The basic configuration of the laser drive device and the laser light emitting device and a procedure of the laser driving method are the same as those in the second embodiment.

According to the laser drive device, the laser light emitting device and the laser driving method according to the present embodiment, in the same way as in the third embodiment, even in the case where an uneven returned light arises, such that the returned lights partially gather at a specific portion of the laser element, deterioration or failure of the laser element due to the returned light can be prevented.

Furthermore, being different from the third embodiment wherein the user has to input the assumable maximum returned light rate, an actual returned light rate is calculated by monitoring the operation condition of the laser element 2. Therefore, the control limitation value does not become unnecessarily small and the laser element 2 can be driven with the largest possible output.

Also, among the laser characteristic information required to be input by the user, the returned light rate requires specialized knowledge the most. Therefore, by eliminating the need for inputting the assumable highest returned light rate for user, users with poor specialized knowledge can also feel safe to use the device without causing any deterioration or failure of the laser element 2.

The present invention is not limited to the explanation of the embodiments above.

For example, the configuration of the optical system 3 is not particularly limited and may be variously modified in accordance with a field of applying the laser element 2.

Other than the above, various modifications may be made within the scope of the present invention.

It should be understood by those skilled in the art that various modifications, combinations, sub-combinations and alternations may occur depending on design requirements and other factors insofar as they are within the scope of the appended claims or the equivalents thereof.

What is claimed is:

1. A laser drive device, comprising:
    a control limitation value calculation means for calculating a control limitation value of an output or current of a laser element based on first laser characteristic information on transmittance or reflectance of an output end face of the laser element, second laser characteristic information on a rated current value and an oscillation threshold current value and third laser characteristic information on a returned light rate to the output end face of the laser element;
    a comparison means for comparing the calculated control limitation value with an input control value; and
    a power source unit for driving the laser element in accordance with said control value when said control value is smaller than said control limitation value.

2. A laser drive device as set forth in claim 1, further comprising:
    a returned light rate calculation means for receiving as an input an output value of said laser element and returned light intensity, calculating a returned light rate of said laser element and outputting said calculated returned light rate to said control limitation value calculation means.

3. A laser drive device as set forth in claim 1, wherein said control limitation value calculation means calculates a control limitation value of an output or a current of said laser element based on said first, second and third laser characteristic information and fourth laser characteristic information on a spot size of returned lights to an output end face of said laser element.

4. A laser drive device as set forth in claim 3, wherein said spot size is calculated by using at least any one of refractive index of an active layer of said laser element, a wavelength of the laser light, numerical aperture of a lens being closest to said laser element and an M square value of the laser light.

5. A laser light emitting device, comprising:
    a laser element;
    a control limitation value calculation means for calculating a control limitation value of an output or current of said laser element based on first laser characteristic information on transmittance or reflectance of an output end face of the laser element, second laser characteristic information on a rated current value and an oscillation threshold current value and third laser characteristic information on a returned light rate to the output end face of the laser element;
    a comparison means for comparing the calculated control limitation value with an input control value; and
    a power source unit for driving the laser element in accordance with said control value when said control value is smaller than said control limitation value.

6. A laser light emitting device as set forth in claim 5, furthermore comprising:
    a light splitting means for splitting a part of returned lights to said laser element;

a light detection means for detecting a returned light intensity split by said light separation means; and a returned light rate calculation means for calculating said returned light rate based on said detected returned light intensity and the output value of said laser element and outputting said calculated returned light rate to said control limitation value calculation means.

7. A laser light emitting device as set forth in claim 5, wherein said control limitation value calculation means calculates the control limitation value of an output or a current of said laser element based on said first, second and third laser characteristic information and fourth laser characteristic information on a spot size of returned lights to an output end face of said laser element.

8. A laser light emitting device as set forth in claim 7, wherein said spot size is calculated by using at least any one of refractive index of an active layer of said laser element, a wavelength of the laser light, numerical aperture of a lens being closest to said laser element and an M square value of the laser light.

9. A laser driving method, including the steps of:

calculating a control limitation value of an output or current of said laser element based on first laser characteristic information on transmittance or reflectance of an output end face of the laser element, second laser characteristic information on a rated current value and an oscillation threshold current value and third laser characteristic information on a returned light rate to the output end face of the laser element;

comparing said calculated control limitation value with an input control value; and driving the laser element in accordance with said control value when said control value is smaller than said control limitation value.

* * * * *